United States Patent
Aparin et al.

(10) Patent No.: US 8,160,514 B2
(45) Date of Patent: Apr. 17, 2012

(54) TRANSMISSION NOISE CANCELLATION

(75) Inventors: Vladimir Aparin, San Diego, CA (US); Aristotele Hadjichristos, Cary, NC (US); Marco Cassia, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 935 days.

(21) Appl. No.: 12/180,350

(22) Filed: Jul. 25, 2008

(65) Prior Publication Data
US 2010/0022206 A1 Jan. 28, 2010

(51) Int. Cl.
*H04B 1/04* (2006.01)
*H04B 17/00* (2006.01)
(52) U.S. Cl. .............. 455/114.2; 455/115.1; 455/671.13
(58) Field of Classification Search .................. 455/501, 455/63.1, 67.13, 114.2, 91, 115.1, 126
See application file for complete search history.

(56) References Cited

U.S. PATENT DOCUMENTS

| 5,959,499 | A | 9/1999 | Khan et al. |
| 6,054,896 | A | 4/2000 | Wright et al. |
| 6,898,257 | B2 * | 5/2005 | Fischer et al. ............... 375/376 |
| 7,095,988 | B2 * | 8/2006 | Ben-Ayun et al. ............ 455/126 |
| 7,310,382 | B2 | 12/2007 | Fonden et al. |
| 7,330,517 | B2 | 2/2008 | Taler et al. |
| 2004/0166813 | A1 | 8/2004 | Mann et al. |

FOREIGN PATENT DOCUMENTS

| EP | 1657814 A1 | 5/2006 |
| EP | 1819040 A1 | 8/2007 |

OTHER PUBLICATIONS

International Search Report & Written Opinion—PCT/US2009/051765, International Search Authority—European Patent Office—Nov. 3, 2009.

* cited by examiner

*Primary Examiner* — Sonny Trinh
(74) *Attorney, Agent, or Firm* — Ramin Mobarhan

(57) ABSTRACT

Exemplary embodiments of the disclosure are directed to down-converting an RF signal of a transmitter to baseband, filtering the down-converted signal, and generating a composite signal based on the filtered down-converted signal and a transmission based-band signal.

21 Claims, 6 Drawing Sheets

TRANSMISSION NOISE CANCELLATION

FIELD

The present disclosure relates generally to transmitters, and more specifically to techniques for reducing noise in radio frequency (RF) transmitters.

BACKGROUND

In a communication system, a transmitter receives a base-band signal from a mobile station modem (MSM), up-converts the base-band signal to radio-frequency (RF) using one or more mixers, then amplifies the RF signal, such as via driver amplifiers and power amplifiers, for transmission via an antenna.

Noise cancellations is important in advanced wireless applications, especially in handset devices because of their relatively small size which increases chances for noise couplings between different components due to their closer physical proximity to each other. One such noise coupling occurs between the transmitter and the input of the receiver which results in reduction in receiver sensitivity, thus degrading reception quality of signals in the receiver's frequency band.

Accordingly, there is a need for reducing noise in transmitters of wireless devices.

DETAILED DESCRIPTION

The techniques described herein are applicable to and may be used for any electronic setting in any electrical or electronic environment in which radio frequency reception is desired. For exemplary purposes only, the exemplary embodiments described herein are presented in the context of a wireless communication environment, though they are not meant to be limited to such, but applicable to any wire or wireless communication setting which use radio-frequency transmission and reception, such as cell-phones, base-stations as well as cable set-top boxes and the likes.

The techniques described herein may be used for various wireless communication networks such as wireless communication networks such as CDMA, TDMA, FDMA, OFDMA and SC-FDMA networks. The terms "network" and "system" are often used interchangeably. A CDMA network may implement a radio technology such as Universal Terrestrial Radio Access (UTRA), cdma2000, etc. UTRA includes Wideband-CDMA (W-CDMA), Low Chip Rate (LCR), High Chip Rate (HCR), etc. CDMA2000 covers IS-2000, IS-95, and IS-856 standards. A TDMA network may implement a radio technology such as Global System for Mobile Communications (GSM). An OFDMA network may implement a radio technology such as Evolved UTRA (E-UTRA), Ultra Mobile Broadband (UMB), IEEE 802.11 (Wi-Fi), IEEE 802.16 (WiMAX), IEEE 802.20, Flash-OFDM®, etc. These various radio technologies and standards are known in the art. UTRA, E-UTRA and GSM are described in documents from an organization named "3rd Generation Partnership Project" (3GPP). CDMA2000 is described in documents from an organization named "3rd Generation Partnership Project 2" (3GPP2). 3GPP and 3GPP2 documents are publicly available. For clarity, certain aspects of the techniques are described below for 3GPP networks.

The word "exemplary" is used herein to mean "serving as an example, instance, or illustration." Any embodiment described herein as "exemplary" is not necessarily to be construed as preferred or advantageous over other embodiments.

Figure 1:
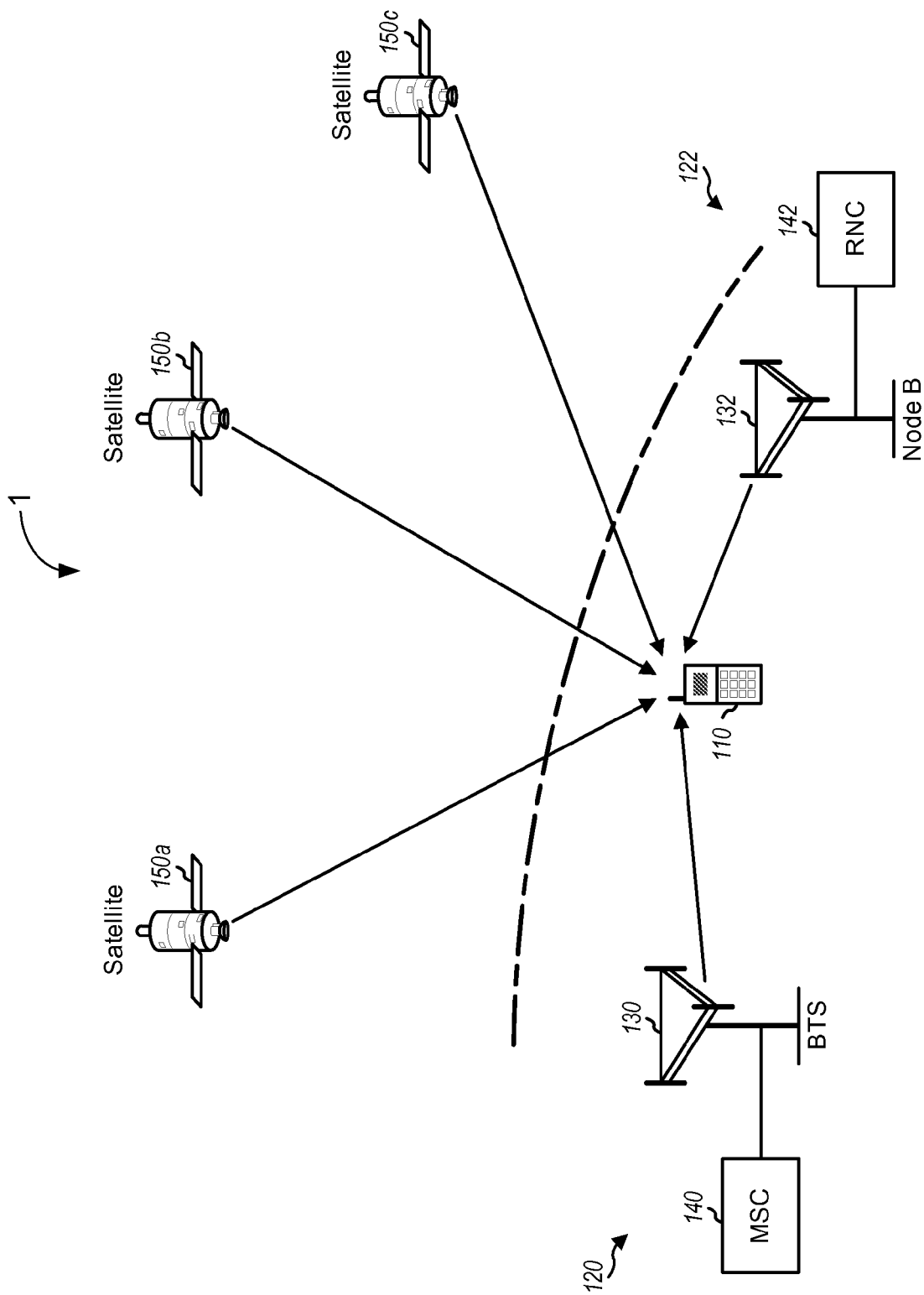
FIG. 1 illustrates an exemplary wireless communication environment in which exemplary embodiments of the disclosure can be practiced.

FIG. 1 illustrates an exemplary wireless communication environment 1 comprising communication systems 120 and 122 and a wireless device 110, such as a multi-antenna wireless device capable of communicating with multiple wireless communication systems 120 and 122. Wireless system 120 may be a CDMA system that may implement one or more CDMA standards such as, e.g., IS-2000 (commonly referred to as CDMA 1x), IS-856 (commonly referred to as CDMA 1x EV-DO), IS-95, W-CDMA, and so on. Wireless system 120 includes a base transceiver system (BTS) 130 and a mobile switching center (MSC) 140. BTS 130 provides over-the-air communication for wireless devices under its coverage area. MSC 140 couples to BTSs in wireless system 120 and provides coordination and control for these BTSs. Wireless system 122 may be a TDMA system that may implement one or more TDMA standards such as, e.g., GSM. Wireless system 122 includes a Node B 132 and a radio network controller (RNC) 142. Node B 132 provides over-the-air communication for wireless devices under its coverage area. RNC 142 couples to Node Bs in wireless system 122 and provides coordination and control for these Node Bs. In general, BTS 130 and Node B 132 are fixed stations that provide communication coverage for wireless devices and may also be referred to as base stations or some other terminology. MSC 140 and RNC 142 are network entities that provide coordination and control for the base stations and may also be referred to by other terminologies.

Wireless device 110 may be a cellular phone, a personal digital assistant (PDA), a wireless-enabled computer, or some other wireless communication unit or device. Wireless device 110 may also be referred to as a mobile station (3GPP2 terminology), a user equipment (UE) (3GPP terminology), an access terminal, or some other terminology. Wireless device 110 is equipped with multiple antennas, e.g., one external antenna and one or more internal antennas. The multiple antennas may be used to provide diversity against deleterious path effects such as fading, multi-path, interference, and so on. An RF modulated signal transmitted from an antenna at a transmitting entity may reach the multiple antennas at wireless device 110 via line-of-sight paths and/or reflected paths. At least one propagation path typically exists between the transmit antenna and each receive antenna at wireless device 110. If the propagation paths for different receive antennas are independent, which is generally true to at least an extent, then diversity increases and the received signal quality improves when multiple antennas are used to receive the RF modulated signal.

Wireless device 110 may or may not be capable of receiving signals from satellites 150. Satellites 150 may belong to a satellite positioning system such as the well-known Global Positioning System (GPS), the European Galileo system, or some other systems. Each GPS satellite transmits a GPS signal encoded with information that allows a GPS receiver on Earth to measure the time of arrival (TOA) of the GPS signal. Measurements for a sufficient number of GPS satellites may be used to obtain an accurate three-dimensional position estimate for the GPS receiver. In general, the wireless device 110 may be capable of communicating with any number of wireless systems of different wireless technologies (e.g., CDMA, GSM, GPS, and so on).

Figure 2:
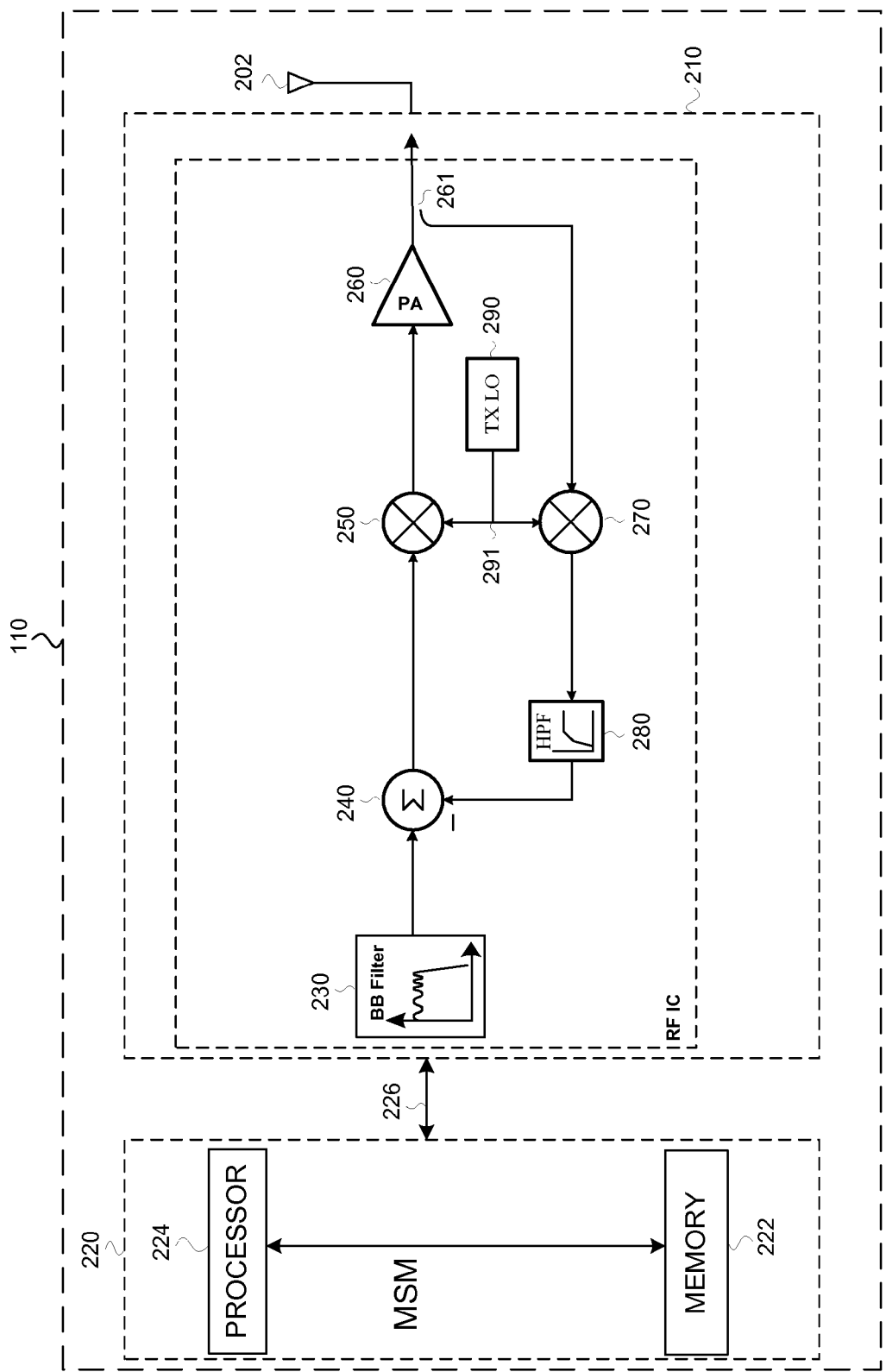
FIG. 2 illustrates an exemplary embodiment of the disclosure.

FIG. 2 is a simplified block diagram illustrating an exemplary wireless device 110. Wireless device 110 includes an exemplary radio-frequency (RF) transmitter 210, which at one end couples to an antenna 202, such as a main antenna, which may be an external antenna, and at the other end is in communication with a mobile station modem (MSM) 220, such as via path 226. MSM 220 comprises a processor 224 which is in communication with a memory 222. In an exemplary embodiment, path 226 comprises a In-phase (I) path and a Quadrature (Q) path. For simplicity of illustration, only one of I or Q paths are shown in the Figures for transmitter 210.

As shown in FIG. 2, an exemplary transmitter 210, such as a CDMA transmitter, includes a base-band (BB) filter 230 which outputs to a signal combiner 240, such as a summation circuit or a subtractor circuit. The signal combiner 240 outputs to an up-converter 250, such as a mixer or a quadrature modulator, for up-converting the base-band signal to radio frequency (RF) based on a transmission local-oscillator signal received from the local oscillator (LO) 290. The up-converter 250 outputs to an amplifier 260, such as a power amplifier which outputs to the external antenna 202 to transmit the amplified up-converted signal.

As further shown in FIG. 2, the power amplifier 260 also outputs to a down-converter 270, such as via a coupler 261. The down-converter 270, such as a mixer or a quadrature demodulator, down-converts the RF signal to base-band based on the transmission local-oscillator signal received from the local oscillator (LO) 290. In an exemplary embodiment, a transmission local-oscillator signal path 291 provides the transmission local-oscillator signal to both the down converter 250 and the up-converter 270. The down-converter 270 outputs to a filter 280, such as high pass filter, to filter the down-converted signal. The filtered down-converted signal is then received in the signal combiner 240, such as a summation circuit or a subtractor circuit, which generates a composite signal based on the filtered down-converted signal and a transmission based-band signal received from the base-band (BB) filter 230, as described below and in greater detail conjunction with FIGS. 3A-D.

Figure 3A:
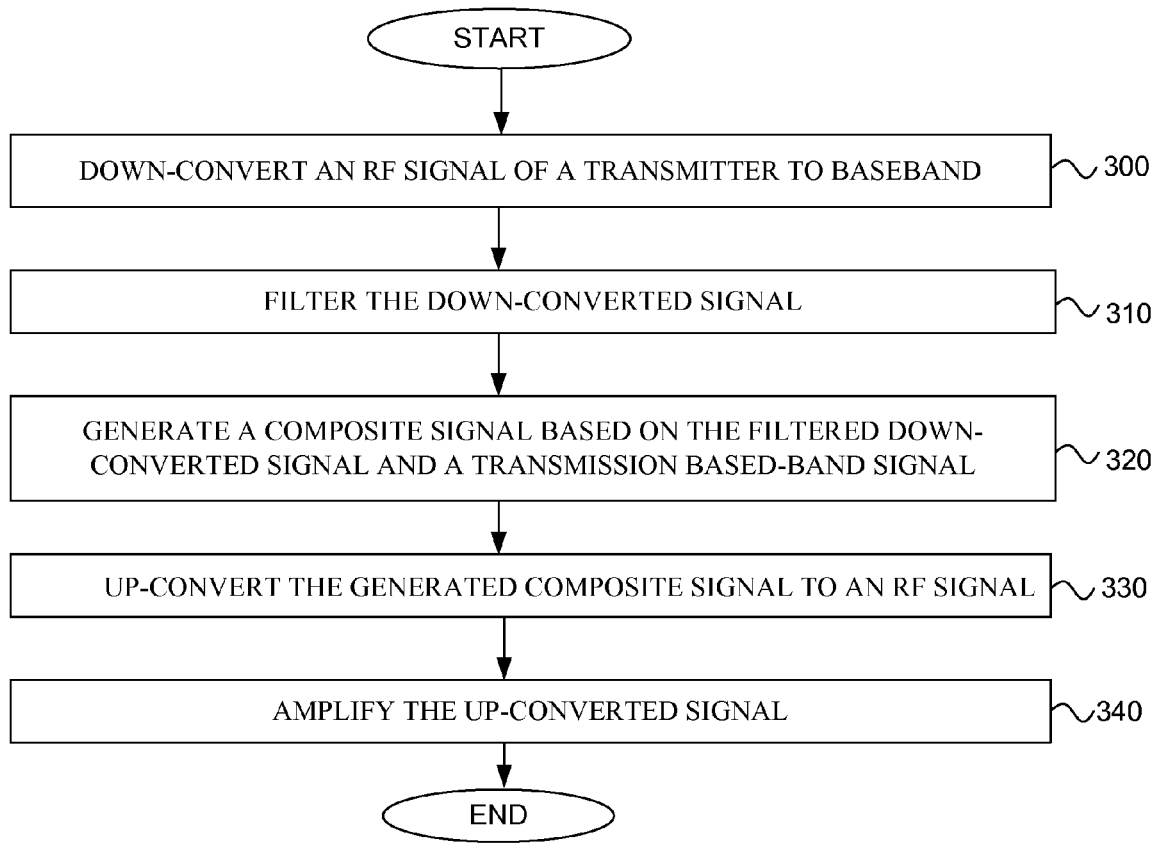
FIGS. 3A-C are flow charts illustrating exemplary methods of the disclosure.
Figure 3B:
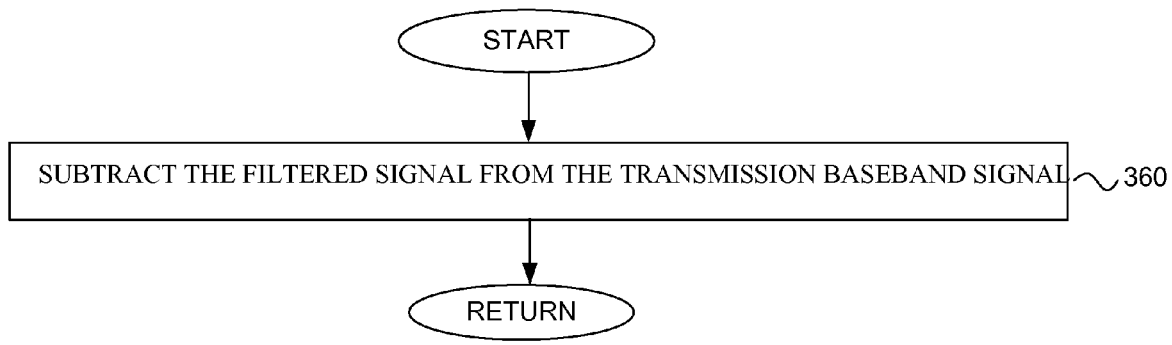

FIGS. 3A-B are flow charts which in conjunction with FIG. 2, illustrate exemplary methods of the disclosure. As shown in FIG. 3A, the process begins in block 300 in which an RF signal of the transmitter 210, such as the output signal of the PA 260, is down-converted to baseband by the down-converter 270, such as a mixer. In an exemplary embodiment, the RF signal of the transmitter 210 contains transmission signal and transmission noise. The down-conversion is performed based on the transmission local-oscillator signal received from the local oscillator (LO) 290. Next, in block 310, the down-converted signal is filtered by the filter 280. In an exemplary embodiment, the filter 280 is a high-pass filter which filters out the transmission signal but allows for the transmission noise to pass. In another exemplary embodiment, the filter 280 is a Least Mean Square (LMS) filter or an equalizer which filters out the transmission signal but allows for the transmission noise to pass. Next in block 320, a composite signal is generated based on the filtered down-converted signal and a transmission based-band signal, such as one received from the BB filter 230, as described in greater detail below in conjunction with FIG. 3B.

Next, in block 330, the generated composite signal is up-converted to an RF signal via the up-converter 250. In an exemplary embodiment, the down-converting and up-converting described in blocks 300 and 330 respectively are performed based on the transmission local-oscillator signal provided by the transmission local-oscillator 290 to the down converter 250 and the up-converter 270, such as by the transmission local-oscillator signal path 291. Using the same transmission local-oscillator signal for both the down-converting and up-converting reduces the need for implementation of additional local-oscillators, such as a transmission local-oscillator for the up-converter 270 and a receiver local-oscillator for the down-converter 250, as well as local-oscillators circuit paths for each of the down converter 250 and the up-converter 270. Next, in block 340, the up-converted signal is amplified by the amplifier 260 for eventual transmitting by the antenna 202. Following block 340, the overall process then ends.

FIG. 3B further illustrates the generating process in block 320 of FIG. 3A. As shown in FIG. 3B, the process begins in block 360 in which the filtered down-converted signal is subtracted from the transmission baseband signal by the signal combiner 240. In an exemplary embodiment, the signal combiner 240 comprises a subtractor circuit to subtract the filtered down-converted signal from the transmission base-band signal. As described above, the filtered down-converted signal comprises the transmission noise with the transmission signal filtered out by the filter 280. Subtracting the transmission noise from a transmission base-band signal received in the signal combiner 240 results in reduction of transmission noise in the generated composite signal outputted from the signal combiner 240, as well as in the overall transmission signal comprising the generated composite signal, which is subjected to the noise generated by up-converter 250 and amplifier 260. In an exemplary embodiment, the subtracting of the filtered down-converted signal from the transmission base-band signal reduces spectral components, such as noise spurs, and distortions corresponding to the overall transmission signal. Following operations of block 360, the process is then returned to block 320 of FIG. 3A.

In an exemplary embodiment, the reduction in spectral components are performed according to the characteristics, such as shape, of the high-pass filter 280. Exemplary embodiments of the invention therefore implement a virtual band-pass response centered at the transmission LO frequency which reduces or cancels the output noise of the transmitter 210 outside the transmitted signal band. Without such noise reduction or cancellation, the output noise of the transmitter 210 may couple to the receiver input (not shown) and reduce the receiver sensitivity. Implementing a virtual band-pass response also reduces the need for external bandpass filters and thus, reduces the overall size and cost of the transmitter 210.

Figure 4A:
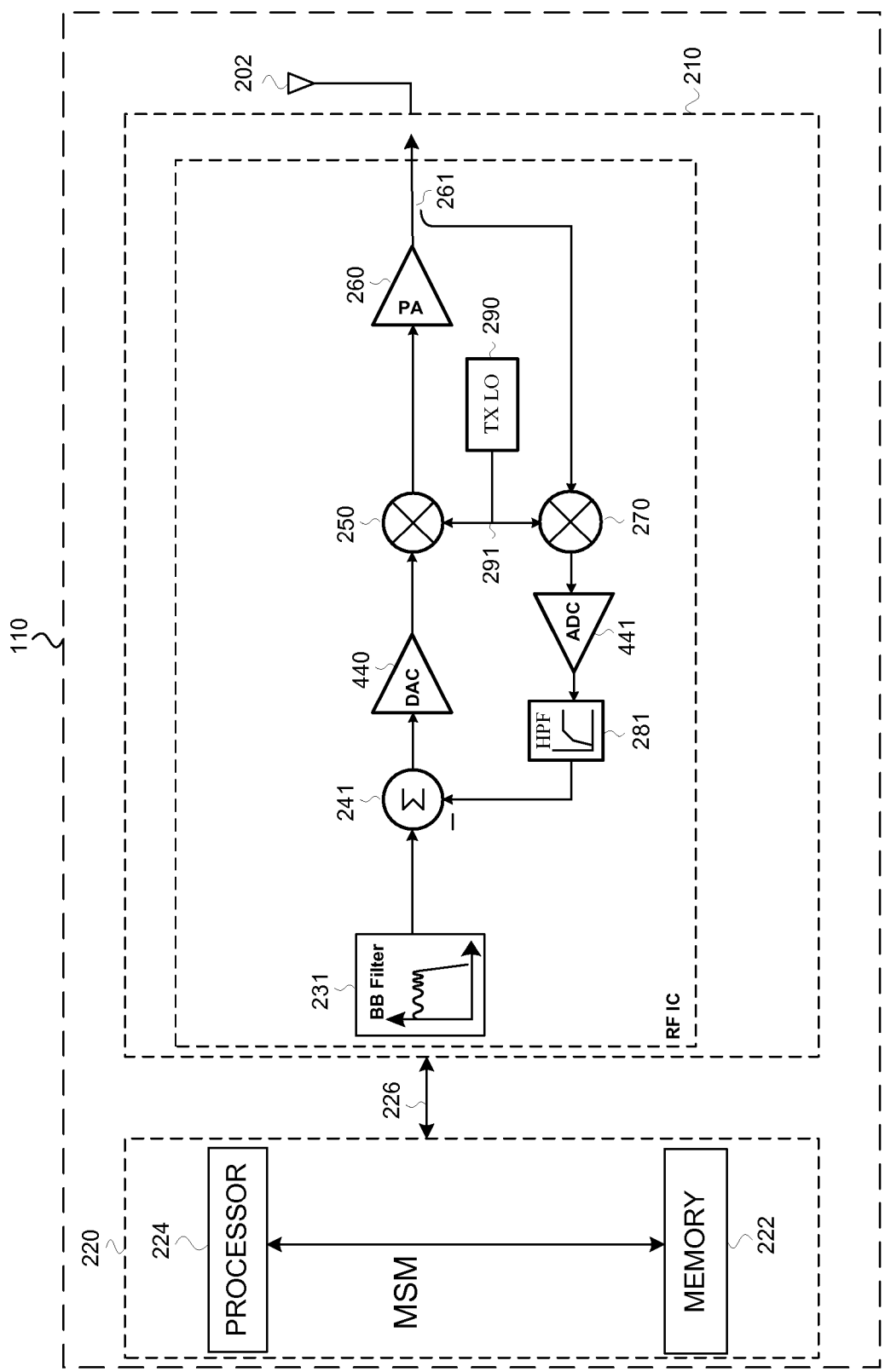
FIG. 4A-B illustrate other exemplary embodiments of the disclosure.
Figure 4B:
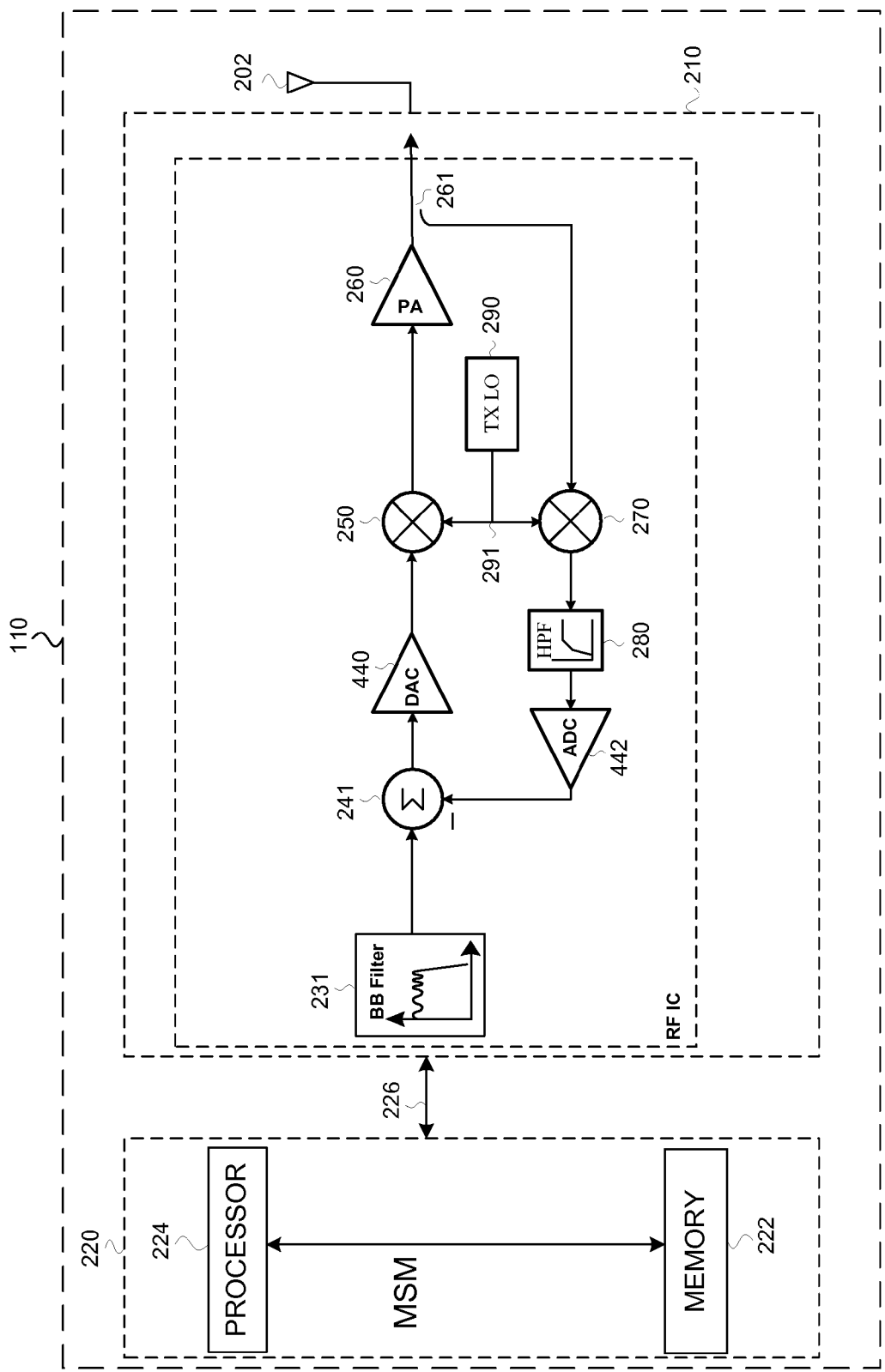

FIGS. 4A-B illustrate other exemplary embodiments of the disclosure. As shown in FIG. 4A an analog to digital converter 441 is positioned at the output of the down-converter 270 to digitize the down-converted RF signal to a digital down-converted signal. The digital down-converted signal is then filtered in a digital filter 281 and outputted to a digital signal combiner 241, such as a digital summation circuit or a digital subtractor circuit. The digital signal combiner 241 then generates a digital composite signal based on the digital filtered down-converted signal and a digital transmission based-band signal, such as one received from a digital base-band filter 231. In an exemplary embodiment, the digital filtered down-converted signal is subtracted from the digital transmission baseband signal by the digital signal combiner 241. In an exemplary embodiment, the digital signal combiner 241 comprises a subtractor circuit to subtract the digital filtered down-converted signal from the digital transmission baseband signal. As also shown in FIG. 4A, a digital to analog converter (DAC) 440 is positioned at the output of the digital signal combiner 241 to convert the generated digital composite signal to an analog composite signal, which is then outputted to the up-converter 250.

FIG. 4B illustrates another exemplary embodiment of the disclosures in which an analog to digital converter 442 is positioned at the output of the filter 280, and outputs to digital signal combiner 241. The digital signal combiner 241 then generates a digital composite signal based on the digital filtered down-converted signal and a digital transmission based-band signal, such as one received from a digital base-band filter 231. In an exemplary embodiment, the digital filtered down-converted signal is subtracted from the digital transmission baseband signal by the digital signal combiner 241. In an exemplary embodiment, the digital signal combiner 241 comprises a subtractor circuit to subtract the digital filtered down-converted signal from the digital transmission baseband signal. As also shown in FIG. 4B, a digital to analog converter (DAC) 440 is positioned at the output of the digital signal combiner 241 to convert the digital composite signal to an analog composite signal, which is then outputted to the up-converter 250.

Figure 3C:
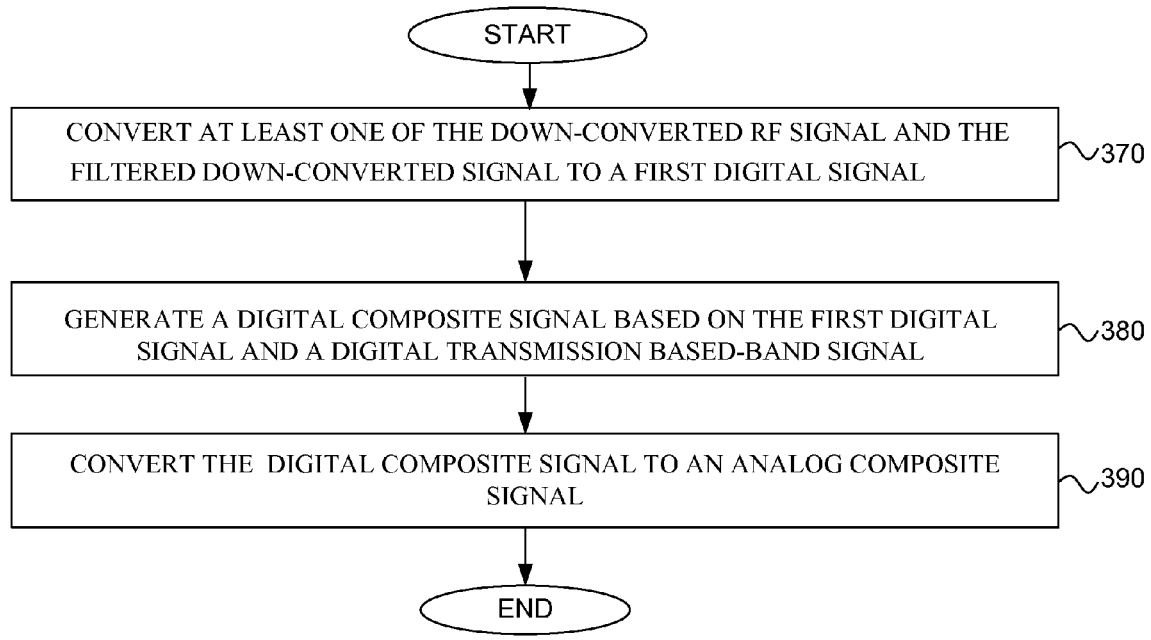

FIG. 3C is a flow chart which in conjunction with FIGS. 4A-B, illustrate exemplary methods of the disclosure. As shown in FIG. 3C, the process begins in block 370 in which a down-converted signal, such as in FIG. 4A or a filtered down-converted signal, such as in FIG. 4B, are converted to a digital signal. Next, in block 380, a digital composite signal is then generated by the digital signal combiner 241 based on the digital signal and a digital transmission based-band signal such as one received from a digital base-band filter 231. Next, in block 390, the digital composite signal is converted to an analog composite signal by the digital to analog converter (DAC) 440. Subsequently the resulting analog signal is then up-converted, amplified and transmitted as described above. Following block 390, the overall process then ends.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodi-

What is claimed is:

1. A method comprising:
   down-converting an RF signal of a transmitter to baseband;
   filtering the down-converted signal; and
   generating a composite signal based on the filtered down-converted signal and a transmission based-band signal received from a base-band filter.

2. The method of claim 1, the generating the composite signal comprising:
   subtracting the filtered signal from the transmission base-band signal.

3. The method of claim 1, further comprising:
   up-converting the generated composite signal to an RF signal; and
   amplifying the up-converted signal.

4. The method of claim 3, further comprising:
   transmitting the amplified up-converted signal.

5. The method of claim 1, the filtering the down-converted signal comprising:
   high-pass filtering the down-converted signal.

6. The method of claim 1, the filtering the down-converted signal comprising:
   Least Mean Square (LMS) filtering the down-converted signal.

7. The method of claim 1, the filtered down-converted signal reduces spectral components corresponding to a transmission signal.

8. The method of claim 7, the spectral components comprising at least one of a noise, spurs, and distortion in the transmission signal.

9. The method of claim 1, the down-converting comprising:
   down-converting based on a transmission local-oscillator signal.

10. The method of claim 9, the up-converting comprising:
    up-converting based on the transmission local-oscillator signal.

11. The method of claim 1, further comprising:
    converting at least one of the down-converted RF signal and the filtered down-converted signal to a first digital signal, wherein the generating further comprising generating a digital composite signal based on the first digital signal and a digital transmission based-band signal; and
    converting the digital composite signal to an analog composite signal.

12. A transmitter comprising:
    a down-converter to convert an RF signal of a transmitter to baseband;
    a filter to filter the down-converted signal; and
    a signal combiner to generate a composite signal based on the filtered down-converted signal and a transmission based-band signal received from a base-band filter.

13. The transmitter of claim 12, further comprising:
    an up-converter for up-converting the generated composite signal to an RF signal; and
    an amplifier to amplify the up-converted signal.

14. The transmitter of claim 13, further comprising:
    an antenna to transmit the amplified up-converted signal.

15. The transmitter of claim 13, further comprising:
    a transmission local-oscillator signal path to provide a transmission local-oscillator signal to the down converter and the up-converter.

16. The transmitter of claim 12, the signal combiner comprising a subtractor circuit to subtract the filtered signal from the transmission baseband signal.

17. The transmitter of claim 12, the filter comprising a high-pass filter.

18. The transmitter of claim 12, further comprising:
    an analog to digital converter (ADC) positioned at the output of at least one of the down-converter and the filter to digitize at least one of the down-converted RF signal and the filtered down-converted signal to a first digital signal, wherein the signal combiner further comprising digital signal combiner to generate a digital composite signal based on the first digital signal and a digital transmission based-band signal; and
    a digital to analog converter (DAC) positioned at the output of the signal combiner to convert the digital composite signal to an analog composite signal.

19. A transmitter comprising:
    means for down-converting an RF signal of a transmitter to baseband;
    means for filtering the down-converted signal; and
    means for generating a composite signal based on the filtered down-converted signal and a transmission based-band signal received from a base-band filter.

20. The transmitter of claim 19, further comprising:
    means for up-converting the generated composite signal to an RF signal; and
    means for amplifying the up-converted signal.

21. The transmitter of claim 19, further comprising:
    means for converting at least one of the down-converting RF signal and the filtered down-converted signal to a first digital signal, wherein the means for generating further comprising means for generating a digital composite signal based on the first digital signal and a digital transmission based-band signal; and
    means for converting digital composite signal to an analog composite signal.

* * * * *